United States Patent
Chan et al.

(10) Patent No.: US 7,994,516 B2
(45) Date of Patent: Aug. 9, 2011

(54) LED MODULE, AND LED CHAIN CONTAINING THE SAME

(75) Inventors: Chi Man Chan, Wan Chai (CN); Huajian Fan, Shenzhen (CN); Yu Bao He, Shenzhen (CN); Xi Yuan He, Hong Kong (CN); Ze Sheng Ye, Shenzhen (CN); Max Yue, Hong Kong (CN)

(73) Assignee: OSRAM Gesellschaft mit beschränkter Haftung, München (DE)

( * ) Notice: Subject to any disclaimer, the term of this patent is extended or adjusted under 35 U.S.C. 154(b) by 103 days.

(21) Appl. No.: 12/384,039

(22) Filed: Mar. 31, 2009

(65) Prior Publication Data
US 2009/0272986 A1 Nov. 5, 2009

(30) Foreign Application Priority Data

Apr. 30, 2008 (CN) .......................... 2008 1 0096631

(51) Int. Cl.
*H01L 33/00* (2010.01)
(52) U.S. Cl. ............. 257/81; 257/84; 257/100; 257/678
(58) Field of Classification Search .................... 257/81, 257/84, 100, 678
See application file for complete search history.

(56) References Cited

U.S. PATENT DOCUMENTS

2008/0136661 A1 * 6/2008 Pederson et al. ......... 340/815.45
* cited by examiner

*Primary Examiner* — Long Pham
(74) *Attorney, Agent, or Firm* — Holtz Holtz Goodman & Chick PC

(57) ABSTRACT

The present invention discloses an LED module comprising: a waterproof enclosure; an LED accommodated in the waterproof enclosure; a wire for coupling the LED module with other LED modules and a driver; and a radiating unit set in the bottom of the waterproof enclosure and exposed to the external environment. The invention further provides an LED chain comprising the above said LED module and a driver coupled with the LED module. The LED chain according to the invention may have a high waterproof level, for example, IP65. The heat generated during the operation of the high power LED module may be transmitted to the external environment in time via a heat sink set on the LED module, thereby effective thermal management for the LED module and a long service life of the LED module may be obtained. Moreover, the finish surface of the driver may be made handsome by encapsulating the driver through the low pressure molding.

6 Claims, 3 Drawing Sheets

LED MODULE, AND LED CHAIN
CONTAINING THE SAME

TECHNICAL FIELD

The present invention generally relates to the technical field of Light Emitting Diode (LED) lighting, and in particular, to an LED module and an LED chain containing the same.

BACKGROUND OF THE INVENTION

As is well known, in the technical field of LED lighting, the LED module and its driver need to have good waterproofness and heat dispersion. In a solution of the prior art, to attain required waterproofness, a plastic enclosure is used to enclose the LED module and epoxy resin or silicon resin is used for potting. In the same way, a driver for the LED module is put in the enclosure and encapsulated with epoxy resin or silicon resin. However, in this method, it is difficult to control the quality of the product so as to realize the required waterproofness. Moreover, the finish surface of the product is not handsome. Furthermore, because the thermal conductivity of plastic material is poor, it is difficult to transmit the heat generated by the LED module and its driver during operation to the external environment, thereby having negative effects on the heat dispersion of the product and the quality of the LED lighting. In another solution, the LED module and the driver may be formed respectively and then electrically connected together when being in use. But in this solution, the above problems concerning poor waterproofness and heat dispersion and inaesthetic product externality still exist.

SUMMARY OF THE INVENTION

To overcome the above defects in the prior art, the invention provides an LED module, which comprises: a waterproof enclosure, an LED accommodated in the waterproof enclosure, a wire for coupling the LED module with other LED modules and a driver, and a radiating unit that is set in the bottom of the waterproof enclosure and exposed to the external environment.

The invention further provides an LED chain, which comprises the above LED module and a driver coupled mutually with the LED module.

Good waterproofness and thermal conductivity may be obtained by the LED module according to the invention. The drive for the LED module according to the invention is encapsulated through low pressure molding process and coupled with the LED module via wires, thus an LED chain of various forms may be formed flexibly as required, and good waterproofness and thermal conductivity may be obtained at the same time.

BRIEF DESCRIPTION OF THE DRAWINGS

The above and other objects, features and advantages of the invention will be more apparent from the description of the embodiments of the invention in conjunction with the drawings, wherein.

DETAILED DESCRIPTION OF THE EMBODIMENTS

Figure 1:
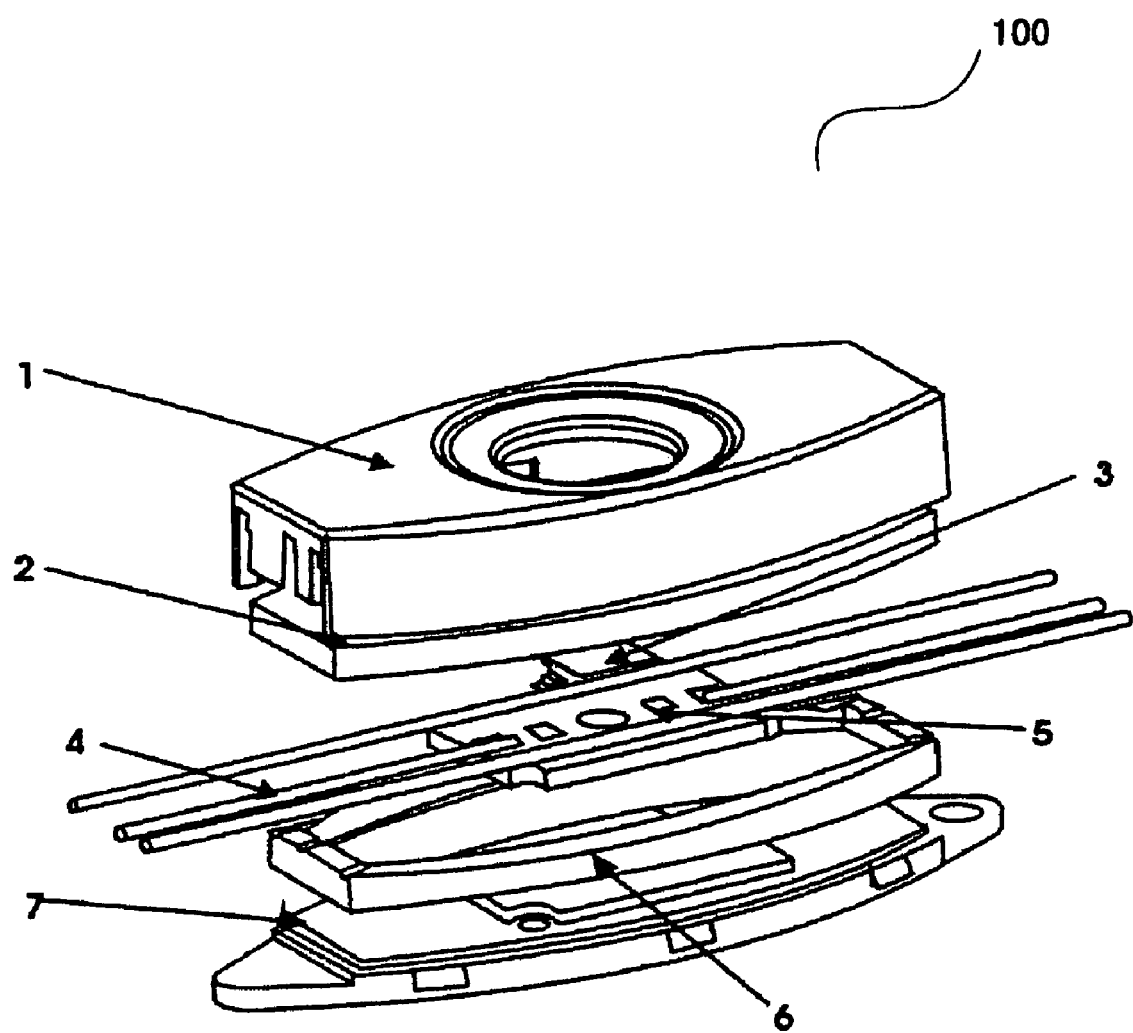
FIG. 1 is a schematic diagram showing the assembly structure of the LED module according to an embodiment of the invention.
Figure 2:
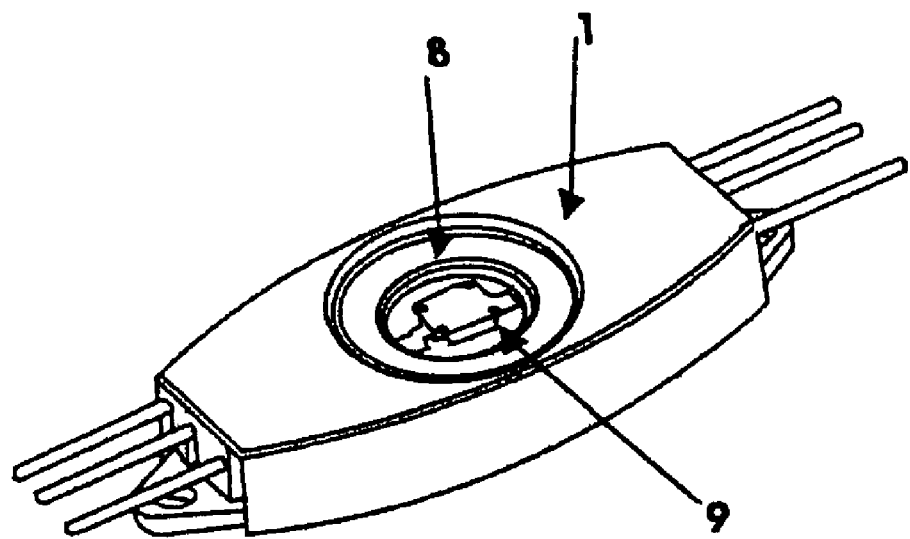
FIG. 2 is a schematic diagram showing the UV glue potting at the an opening in the silicone rubber upper part of the plastic enclosure and the LED module as shown in FIG. 1.

FIG. 1 is a schematic diagram showing the assembly structure of the LED module according to an embodiment of the invention. As shown in the figure, a LED module 100 according to the invention includes a plastic cover 1 adapted to protect the LED module against external moisture and contaminant; a silicone rubber upper part 2 and a silicone rubber lower part 6 adapted to form a waterproof enclosure together with the plastic cover 1 for realizing the waterproofness of the LED module; a LED 3 and a Metal Core Printed Circuit Board (MCPCB) 5 adapted to form a light emitting unit of the LED module; wires 4 adapted to electrically connect the LED module 100 with other LED modules and a driver; and a heat sink 7 set on the bottom of the LED module and exposed to the external environment, adapted to transmit the heat generated by the LED module during the operation to the external environment in time, thereby realizing effective thermal management of the LED module. Moreover, as shown in FIG. 2, an opening 8 and an opening 9 are respectively set on the plastic cover 1 and the silicone rubber upper part 2 of the LED module as shown in FIG. 1 to lead the light from the LED 3 to the outside. UV glue potting may be carried out at the openings 8 and 9 to enhance the waterproofness of the LED module 100. Furthermore, the exterior of the MCPCB 5 may be lacquered to isolate external moisture.

Those skilled in the art may appreciate that, the structure of the LED module according to the invention is not limited to the above specific embodiment, and there may exist various modifications and substitutions. For example, rubber materials other than silicone rubber may also be selected to fabricate the upper part 2 and the lower part 6. As an alternation of UV glue potting, epoxy resin may also be used for potting at the openings 8 and 9 on the plastic cover 1 and the silicone rubber upper part 2 of the LED module. Moreover, the number of the wires 4 for electrically connecting the LED module 100 with other LED modules and the driver is not limited to three as shown in FIG. 1, and the number may be set according to practical requirements, for example, the specific arrangement of the LED module and the driver.

Figure 3:
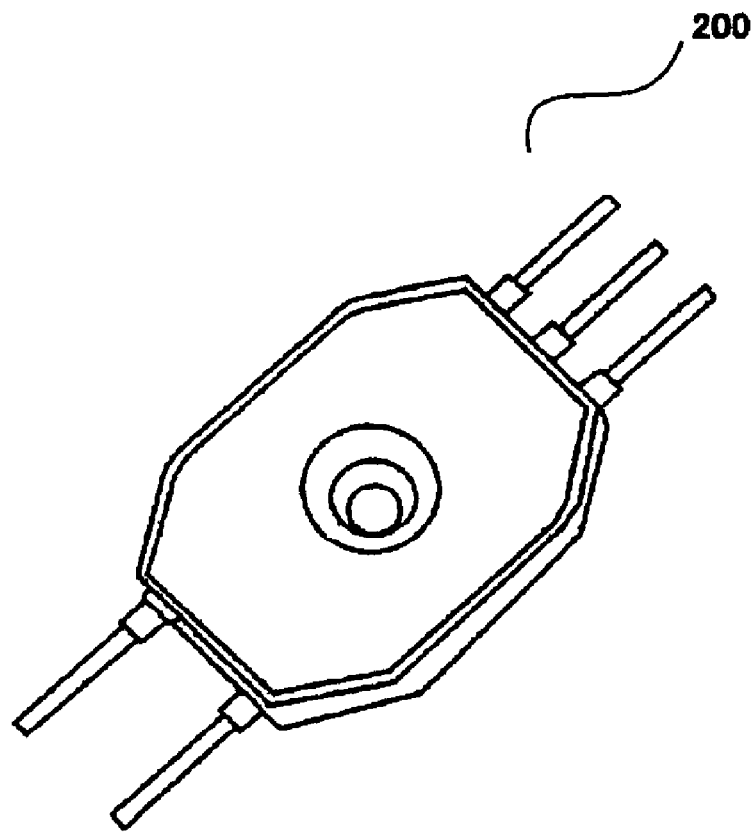
FIG. 3 is a schematic diagram of the driver used for the LED module as shown in FIG. 1 according to an embodiment of the invention.

FIG. 3 is a schematic diagram of a driver 200 used for the LED module 100 as shown in FIG. 1 according to an embodiment of the invention. For example, the driver 200 may be a constant current driver fabricated through PCBA. The driver is manufactured through the low pressure molding. In comparison with the method for achieving the waterproofness and product protection through the epoxy resin potting or mechanical structure in the prior art, the low pressure molding can make the finish surface of the end product more handsome, the cost lower, and the performance of the driver more reliable. As shown in the figure, two terminals on the lower part of the driver 200 are the terminals connected with the power supply, and the three terminals on the upper part are the terminals connected with the LED module. It is easy to understand that, in the driver 200, the number of the terminals connected with the LED module is related to the number of the wires in the LED module, as shown in FIG. 1. Moreover, the exterior of the circuit board PCBA for fabricating the driver may be lacquered to isolate the external moisture. For example, the driver 200 may be a constant current driver.

Figure 4:
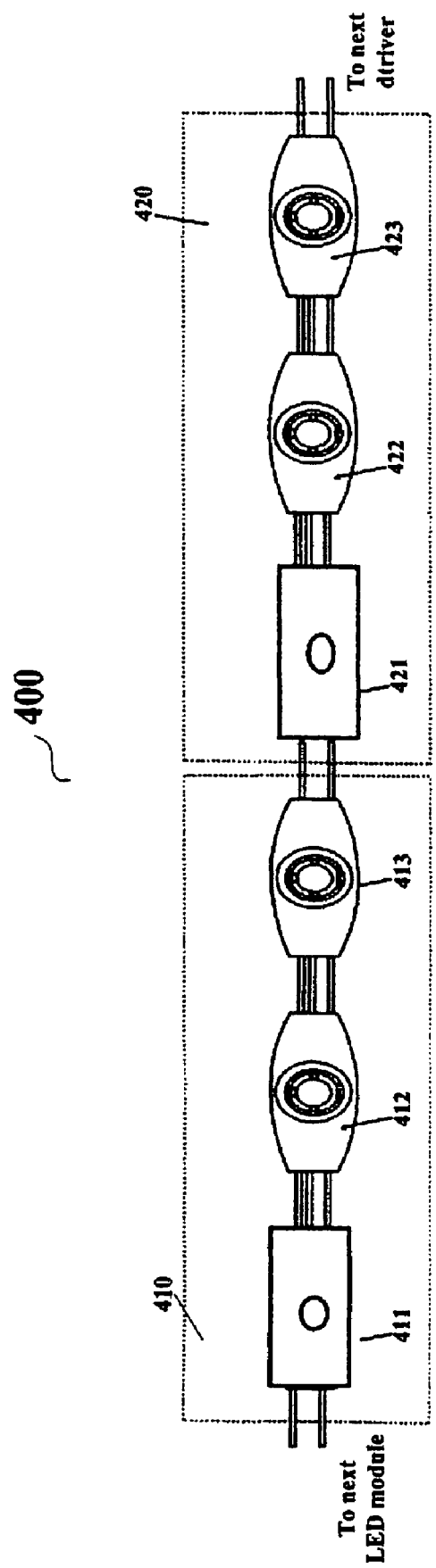
FIG. 4 is a schematic diagram of the LED chain according to an embodiment of the invention.

FIG. 4 is a partial schematic diagram showing a high power LED chain 400 according to an embodiment of the invention. Two light emitting units 410 and 420 of the LED chain 400 are shown. As shown in the figure, in the light emitting unit 410, a driver 411 drives at least one LED module (in this example, two LED modules), i.e. the LED module 412 and LED module 413; in the light emitting unit 420, a driver 421 drives two LED modules, i.e. the LED module 422 and LED module 423. The driver 411 and the driver 421 respectively corresponds to the driver manufactured through the low pressure molding according to the invention as shown in the above FIG. 3; the LED modules 412, 413, 422 and 423 respectively corresponds to the LED module 100 according to the invention as shown in the above FIG. 1 and FIG. 2. In each light emitting unit, the driver and the LED modules are connected in series, while the light emitting units are connected in parallel. Although only two light emitting units 410 and 420 are shown in FIG. 4, one LED chain may include more emitting units, for example, five emitting units. The number of the LED modules in each light emitting unit is not limited to two as shown in the figure, for example, the number may be five. Those skilled in the art may appreciate that, the number of the light emitting units in one LED chain and the number of the LED modules in one light emitting unit may be configured according to practical requirements and the performance of the elements used, without being limited to the case in the embodiment shown in FIG. 4.

By the invention, an LED chain may be provided in which a high power, for example, greater than 1 watt, LED module is connected with a driver through wires. As described above, by the above special structure design of the LED module, the LED chain according to the invention may achieve a high waterproof level, for example, IP65. Specifically, good waterproofness and external moisture isolation may be realized by using silicone rubber and UV glue potting in the LED module and lacquering the MCPCB 5 in the LED module and the exterior of the PCBA for fabricating the driver 200. The heat sink 7 set on the LED module 100 can transmit the heat generated by the high power LED module 100 during the operation to the external environment in time, so that the effective thermal management of the LDE module 100 may be realized and a long service life may be obtained. Moreover, the finish surface of the driver 200 can be made more handsome by encapsulating the driver through the low pressure molding. Additionally, because no epoxy resin or silicon resin is used for potting on the surface of the LED module 100 as in the prior art, the LED module 100 according to the invention has excellent light emitting performance. For example, the LED chain according to the invention may be used for signage and cove lighting, etc.

Although the preferred embodiments of the present invention has been disclosed for illustrative purposes, those skilled in the art will appreciate various modifications, additions and substitutions, without departing from the scope and spirit of the invention as disclosed in the accompanying claims.

What is claimed is:

1. A Light Emitting Diode, LED, module, comprising:
a waterproof enclosure;
an LED accommodated in the waterproof enclosure;
a wire for coupling the LED module with other LED module and a driver; and
a radiating unit that is set in the bottom of the waterproof enclosure and exposed to the external environment; and
wherein the waterproof enclosure comprises: a plastic cover, an upper part made from rubber material and a lower part made from rubber material; and
wherein the LED is set between the upper part and the lower part, and an opening for leading the light from the LED to the outside is set in the plastic cover and the upper part respectively.

2. The LED module according to claim 1, wherein the rubber material is silicone rubber, and UV glue potting process is performed on the openings.

3. A Light Emitting Diode, LED, chain, wherein the LED chain comprises the LED module according to claim 1 or 2 and a driver coupled with the LED module.

4. The LED chain according to claim 3, wherein the LED chain comprises one or more LED units, each LED unit comprises a driver and one or more LED modules driven by the driver, and wherein said one or more LED modules in each LED unit are connected in series, and said one or more LED units are connected in parallel.

5. The LED chain according to claim 3, wherein the driver is a constant current driver encapsulated through low pressure molding.

6. The LED chain according to claim 4, wherein the driver is a constant current driver encapsulated through low pressure molding.

\* \* \* \* \*